United States Patent [19]

Karanicolas

[11] Patent Number: 6,094,093
[45] Date of Patent: Jul. 25, 2000

[54] LOW-VOLTAGE INPUT BUFFER

[75] Inventor: Andrew N. Karanicolas, Morganville, N.J.

[73] Assignee: Lucent Technologies Inc., Murray Hill, N.J.

[21] Appl. No.: 08/795,195

[22] Filed: Feb. 4, 1997

[51] Int. Cl.$^7$ ..................................................... G06G 7/12
[52] U.S. Cl. ............................................................ 327/560
[58] Field of Search ..................... 327/560, 561, 327/562, 563; 341/140

[56] References Cited

U.S. PATENT DOCUMENTS 4,146,844  3/1979  Quinn ........................................ 330/149
5,587,689  12/1996  Bowers ...................................... 330/254

*Primary Examiner*—Jeffrey Zweizig
*Attorney, Agent, or Firm*—Steve Mendelsohn

[57] ABSTRACT

The input buffer circuit achieves open-loop linearization at low voltage by generating diode voltages independently from resistor voltages using two separate amplifiers—a main amplifier to generate the resistor voltages and an auxiliary amplifier to generate the diode voltages. Another component in the input buffer, such as a transconductance amplifier, provides the functionality of adding the diode and resistor voltages together to generate the output signal of the input buffer. The input buffer may be used in a track-and-hold amplifier (TH amp) having open-loop linearization yet requiring low power supply voltage and low power consumption. In one embodiment of the TH amp, two input buffers each receive a differential input and both generate two output signals, where the output signals from one input buffer are out of phase with the output signals from the other input buffer. Two switch circuits each receive one signal from each input buffer and each switch circuit generates an output signal that is accumulated in one of two hold capacitors, when the switch circuit is closed (i.e., track mode). When the switch circuits are open (i.e., hold mode), two output buffers read out the signals accumulated in the hold capacitors as the differential output of the TH amp.

16 Claims, 8 Drawing Sheets

LOW-VOLTAGE INPUT BUFFER

CROSS-REFERENCES TO RELATED APPLICATIONS

This nonprovisional U.S. national application, filed under 35 U.S.C. § 111(a), claims, under 35 U.S.C. § 119(e)(1), the benefit of the filing date of provisional U.S. national application Ser. No. 60/035,866, filed under 35 U.S.C. § 111(b) on Jan. 22, 1997 as attorney docket name Karanicolas 2, the teachings of which are incorporated herein by reference. This application is related to concurrently filed U.S. application Ser. No. 08/795,290, now U.S. Pat. No. 6,031,398, filed concurrently as attorney docket name Karanicolas 3 and entitled "Reduced-Feedthrough Switch Circuit," the teachings of which are incorporated herein by reference.

BACKGROUND OF THE INVENTION

1. Field of the Invention

The present invention relates to input buffers, and, in particular, to input buffers for track-and-hold amplifiers for use in applications like high-speed analog-to-digital converters.

2. Description of the Related Art

High-speed analog-to-digital (A/D) converters are important hardware components in many digital signal processing applications. As the performance requirements of mixed-signal and communications systems continue to increase, subsystems such as A/D converters are required to meet higher sampling frequencies and resolutions. At the same time, there is increasing pressure to reduce the power supply voltage. Some A/D converters have a track-and-hold amplifier (TH amp) at the front end and a quantizer at the back end. The performance of such A/D converters is often limited by the performance of the TH amp.

FIG. 1 shows a block diagram of a generalized open-loop track-and-hold amplifier 100 typically used in applications such as A/D converters. Although one of the characteristics of a closed-loop TH amp architecture is high-accuracy, the frequency response limitation of such an approach is typically a dominant design tradeoff. As a result, the open-loop TH amp architecture of FIG. 1 is often employed for high-frequency applications. TH amp 100 has input buffer 102 followed by switch 104, hold capacitors 106, and output buffer 108. Input buffer 102 provides isolation between switch 104 and the differential analog inputs ($V_{f1}$ and $V_{f2}$). Output buffer 108 is intended to drive the input of another component (e.g., the quantizer of an A/D converter), where the other component is on the same integrated circuit as TH amp 100.

In operation, the state of switch 104 (i.e., either open or closed) is controlled by two control signals: the track control signal $V_{TK}$ and the hold control signal $V_{HD}$. When ($V_{TK} > V_{HD}$), switch 104 is closed and voltages corresponding to the differential analog inputs ($V_{f1}$ and $V_{f2}$) are accumulated in hold capacitors 106. When ($V_{HD} > V_{TK}$), switch 104 is open and the voltages accumulated in hold capacitors 106 are available to be transmitted by output buffer 108 as the output of TH amp 100.

One possible implementation of a track-and-hold circuit is described in P. Vorenkamp and J. P. M. Verdaasdonk, "Fully Bipolar, 120-Msample/s 10-b Track-and-Hold Circuit," *IEEE Journal of solid-State Circuits*, vol. 27, no. 7, pp. 988–992, July 1992 ("the Vorenkamp reference"), the teachings of which are incorporated herein by reference. In that implementation, the input buffer is a common emitter differential amplifier with a linearization diode in series with each collector. One disadvantage of this approach is that the d-c bias voltage from the series diodes limits power supply reduction. For high-speed systems with relatively low resolution, the diodes can be omitted. However, to prevent serious degradation of linearity, a relatively high bias current in the differential amplifier is required, as described in B. Pregardier, et al. "A 1Gsample/s 8b Silicon Bipolar Track&Hold IC," *IEEE International Solid-State Circuits Conference*, San Francisco, Calif., February 1995, the teachings of which are incorporated herein by reference.

Another possible implementation of a track-and-hold circuit is described in R. Jewett, et al., "A 12b 20MS/s Ripple-through ADC," *IEEE International Solid-State Circuits Conference*, San Francisco, February 1992, the teachings of which are incorporated herein by reference. In that implementation, an A/D converter employs an amplifier with a gain of two that requires two diodes in series with each collector. In this case, power supply reduction is even further limited.

FIG. 2 shows a circuit diagram of a basic input buffer design that could be used for input buffer 102 of TH amp 100 of FIG. 1. Input buffer 102 is essentially a differential amplifier formed by two transistor devices ($Q_1$ and $Q_2$). The emitters of devices $Q_1$ and $Q_2$ are each biased with a current source $I_{B1}$. The dynamic range of the differential amplifier is extended by the emitter resistor $2R_1$. When a differential input ($V_{f1}$ and $V_{f2}$) is applied, the collector current of each device has a nonlinearity that is encoded by the base-emitter junctions with the series emitter resistance $2R_1$. The collectors of devices $Q_1$ and $Q_2$ are each loaded with a series connection of a resistor $R_1$ and a diode-connected device ($Q_3$, $Q_4$). Thus, the collector current nonlinearity is decoded resulting in an essentially linear transfer characteristic.

FIG. 3 shows the transfer characteristic of the buffer circuit of FIG. 2 with the output analyzed as the sum of two contributions. The first contribution is the differential voltage from the resistor loads ($V_R$). The second contribution is the differential voltage from the diode loads ($V_D$). Thus, the total output is $V_{OUT} = V_R + V_D$.

FIG. 4 shows the integral nonlinearity (INL) as a fraction of the full-scale (FS) output for the buffer circuit of FIG. 2. Notice that $INL(V_{OUT}) = INL(V_R) + INL(V_D)$ is approximately zero. Without the linearization diodes, the simulated total harmonic distortion (THD) is less than −50 dB.

FIG. 5 shows a circuit diagram of a basic design that could be used in implementing TH amp 100 of FIG. 1. In such an implementation, the circuit of FIG. 5 corresponds to half of switch 104, one hold capacitor 106, and half of output buffer 108 of TH amp 100, as depicted in FIG. 1. Devices $Q_1$ and $Q_2$ are used to steer current to the emitter follower $Q_3$. When ($V_{TK} > V_{HD}$), the switch is in the track mode (i.e., closed) as the bias current $I_{B1}$ is steered to device $Q_3$. When ($V_{TK} < V_{HD}$), the switch is in the hold mode (i.e., open) as the current is steered towards bias voltage $V_{CC}$ via the load resistor $R_1$ in the input buffer stage of FIG. 2 preceding the switch. The emitter-follower-based switch directly drives the hold capacitor (e.g., $C_H \sim 2.5$ pF). The hold capacitor output then drives the emitter follower output buffer $Q_4$.

Some of the disadvantages of track-and-hold amps having input buffers based on the design of input buffer 102 of FIG. 2 are that the input buffers require relatively high power supply voltage and high power consumption.

SUMMARY OF THE INVENTION

It is an aspect of the present invention to provide low-voltage input buffers for such applications as track-and-hold amplifiers.

Embodiments of the present invention are directed to a buffer circuit that is adapted to generate diode voltages from an input independent of resistor voltages that are also generated from the input, and is further adapted to combine the diode voltages and the resistor voltages to generate an output.

Other embodiments of the present invention are directed to a track-and-hold circuit adapted to generate an output from an input, comprising (a) a main input buffer adapted to generate two outputs from the input; (b) a replica input buffer adapted to generate two outputs from the input, wherein the outputs from the replica input buffer are substantially out of phase with the outputs from the main input buffer; (c) a first switch circuit connected to receive an output from the main input buffer and an output from the replica input buffer and adapted to generate a first-switch output signal; (d) a second switch circuit connected to receive another output from the main input buffer and another output from the replica input buffer and adapted to generate a second-switch output signal; (e) a first hold capacitor, one side connected to the output of the first switch circuit, another side adapted to be connected to a bias voltage source, and adapted to accumulates the first-switch output signal while the first switch circuit is closed; (f) a second hold capacitor, one side connected to the output of the second switch circuit, another side adapted to be connected to a bias voltage source, and adapted to accumulate the second-switch output signal while the second switch circuit is closed; (g) a first output buffer connected to the output of the first switch circuit and adapted to generate a first half of the output from the accumulated first-switch output signal when the first switch is open; and (h) a second output buffer connected to the output of the second switch circuit and adapted to generate a second half of the output from the second-switch output signal when the second switch is open. At least one of the main input buffer and the replica input buffer is a buffer circuit that is adapted to generate diode voltages from an input independent of resistor voltages that are also generated from the input, and the buffer circuit is further adapted to combine the diode voltages and the resistor voltages to generate an output.

BRIEF DESCRIPTION OF THE DRAWINGS

Other aspects, features, and advantages of the present invention will become more fully apparent from the following detailed description, the appended claims, and the accompanying drawings in which:

DETAILED DESCRIPTION

Embodiments of the present invention are directed to input buffers for use in, for example, a track-and-hold (TH) amplifier intended for such applications as the front end of a low-voltage sampling A/D converter. Such TH amps employ open-loop linearization techniques that are compatible with low-voltage operation and a range of amplifier gains.

Figure 6:
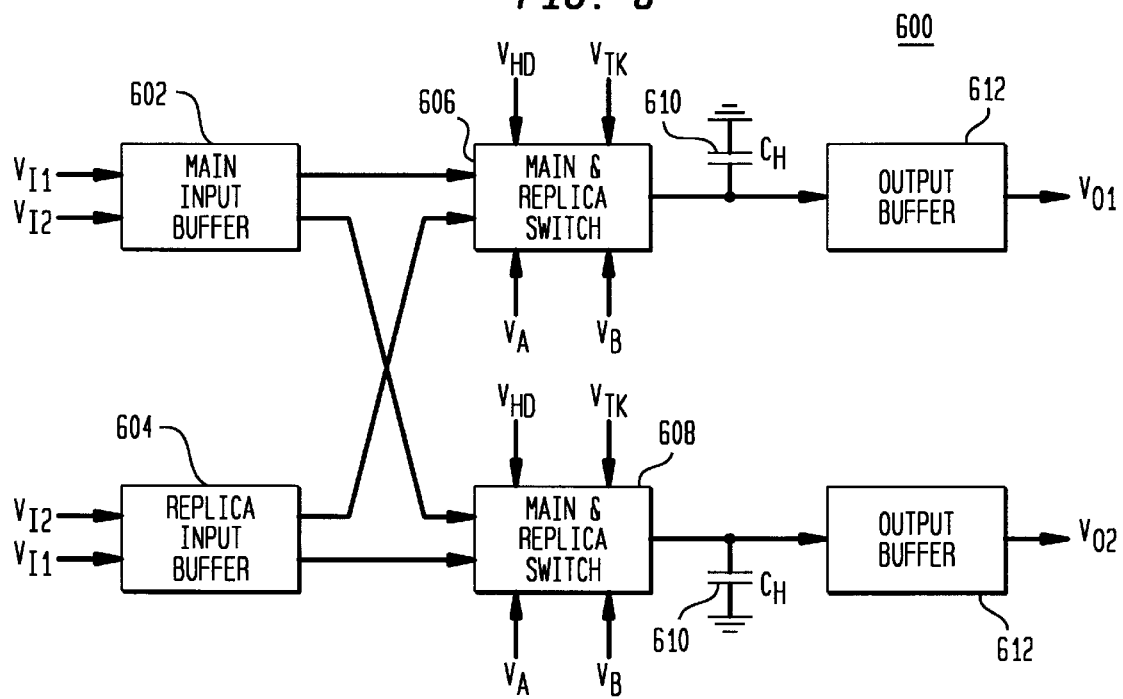
FIG. 6 shows a block diagram of a track-and-hold amplifier, according to one embodiment of the present invention.

FIG. 6 shows a block diagram of track-and-hold amplifier 600, according to one embodiment of the present invention. As shown in FIG. 6, main input buffer 602 and replica input buffer 604 both receive the differential input ($V_{f1}$ and $V_{f2}$) and each buffer generates two outputs, one going to first switch circuit 606 and the other going to second switch circuit 608. Thus, first and second switch circuits 606 and 608 each receive two signals, one from main input buffer 602 and one from replica input buffer 604. In addition, first and second switch circuits 606 and 608 each open and close under the control of control signals $V_{TK}$, $V_{HD}$, $V_A$, and $V_B$. When the switch circuits are closed, voltages are accumulated in hold capacitors 610 and, when the switch circuits are open, the accumulated voltages are read out by output buffers 612 to form the differential output ($V_{O1}$ and $V_{O2}$) of TH amp 600.

Figure 7:
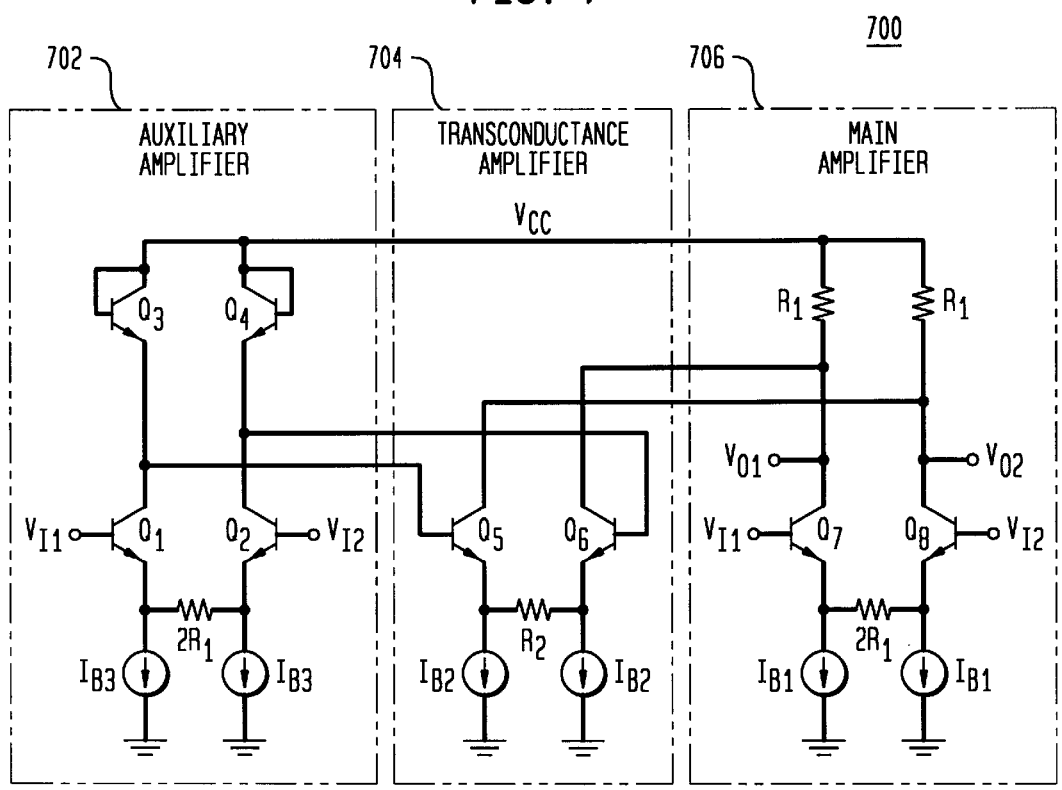
FIG. 7 shows a block diagram of an input buffer having open-loop linearization, according to one embodiment of the present invention.

FIG. 7 shows a block diagram of input buffer 700 having open-loop linearization, according to one embodiment of the present invention. In one implementation of TH amp 600 of FIG. 6, input buffer 700 is used for each of main input buffer 602 and replica input buffer 604. Input buffer 700 comprises auxiliary amplifier 702, transconductance amplifier 704, and main amplifier 706, each of which has a fully differential design.

Figure 1:
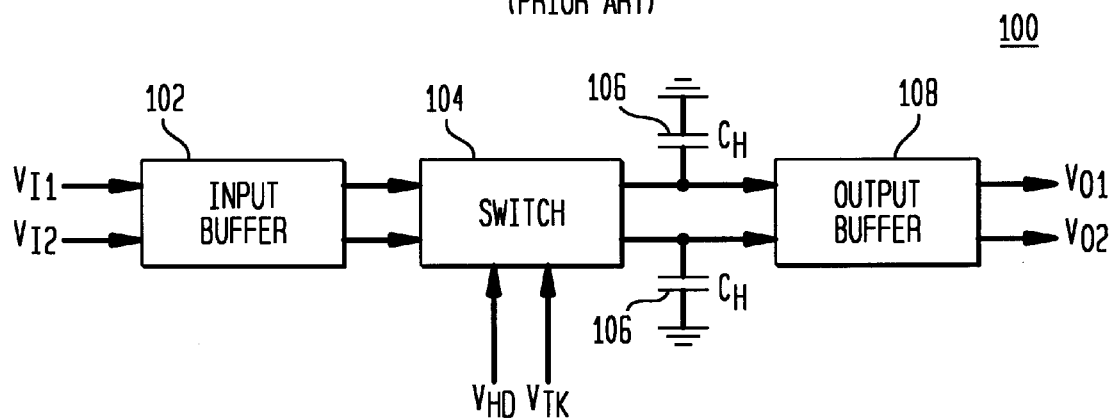
FIG. 1 shows a block diagram of a generalized open-loop track-and-hold amplifier typically used in applications such as A/D converters.
Figure 2:
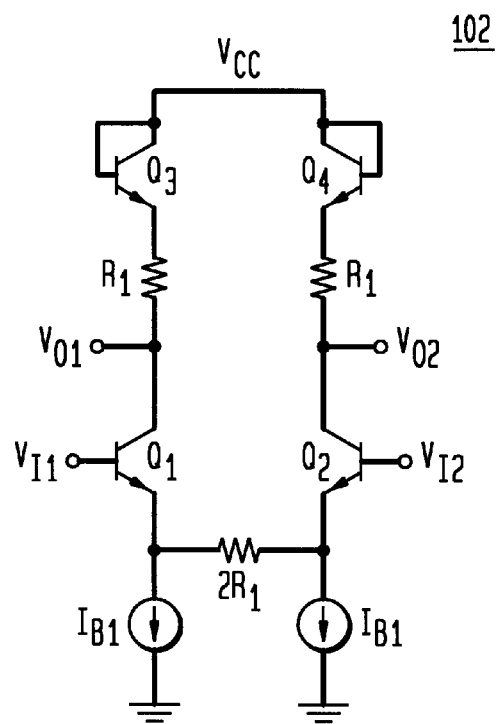
FIG. 2 shows a circuit diagram of a basic input buffer design that could be used for the input buffer of the track-and-hold amplifier of FIG. 1.
Figure 3:
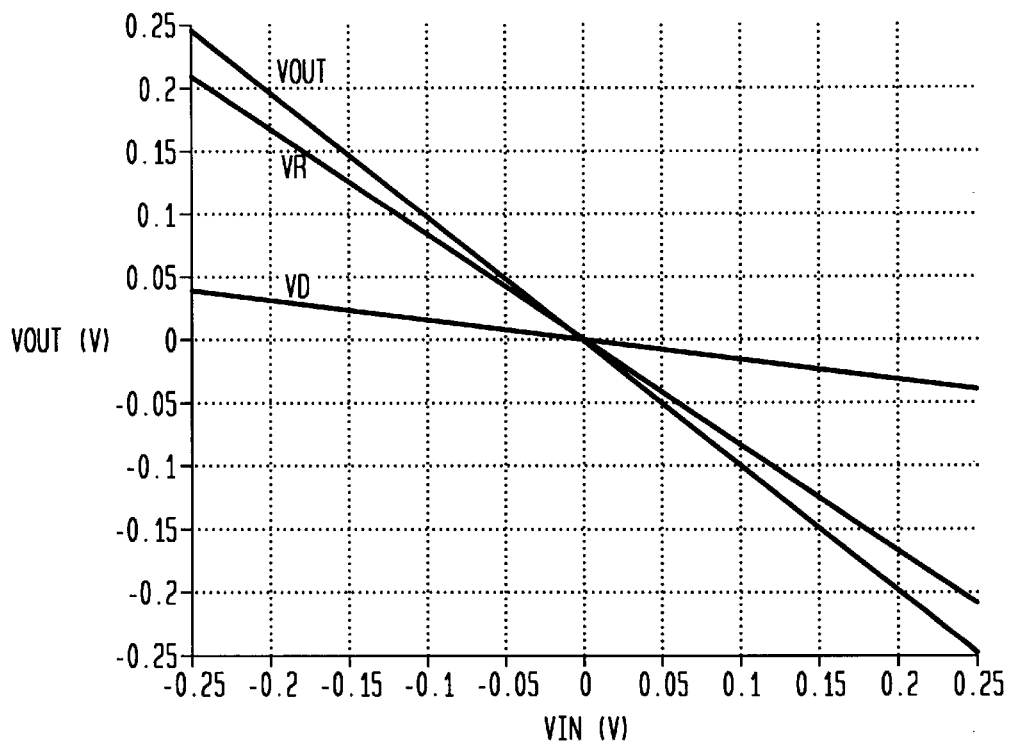
FIG. 3 shows the transfer characteristic of the buffer circuit of FIG. 2.
Figure 4:
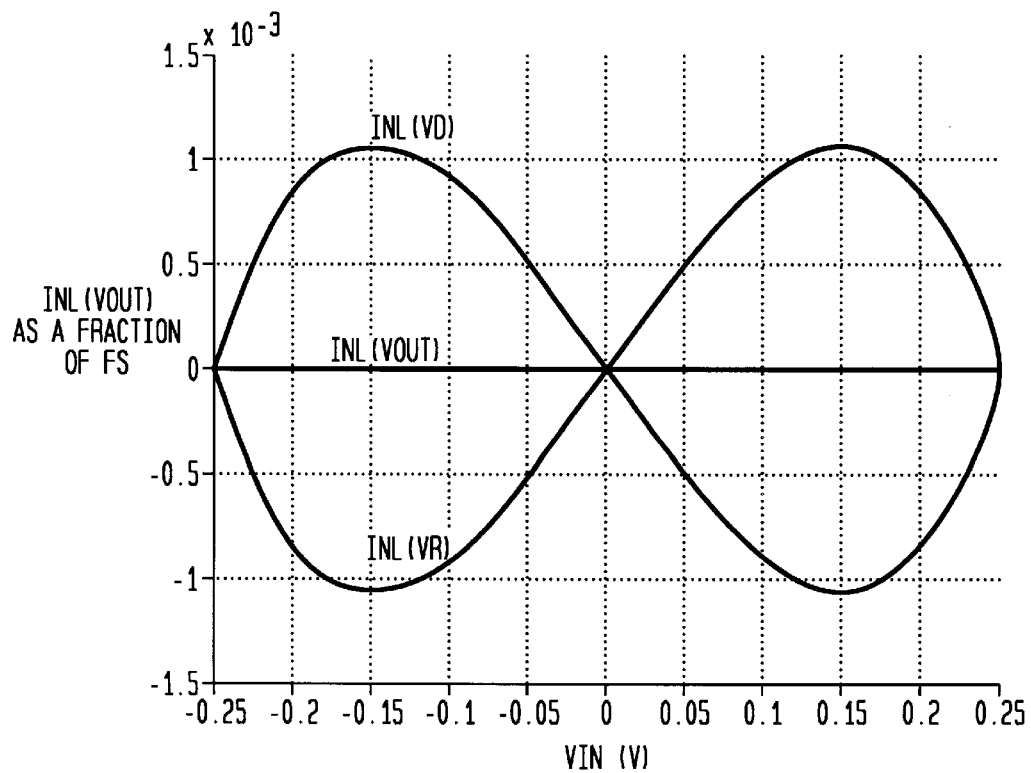
FIG. 4 shows the integral nonlinearity as a fraction of the full-scale output for the buffer circuit of FIG. 2.
Figure 5:
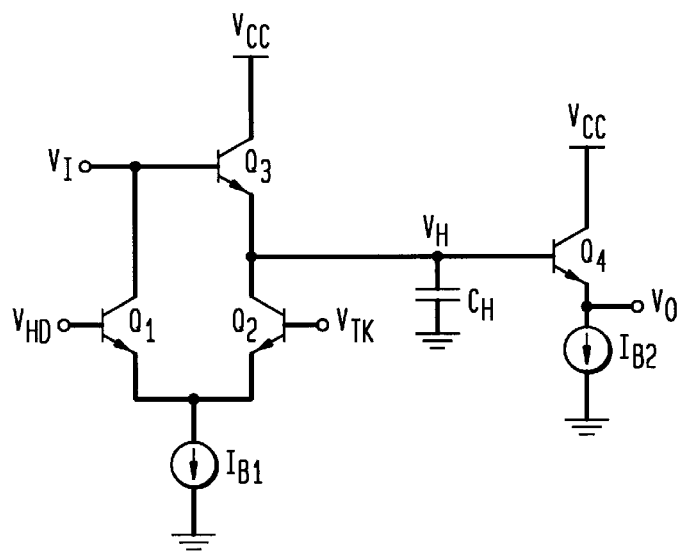
FIG. 5 shows a circuit diagram of a basic design that could be used in implementing the track-and-hold amplifier of FIG. 1.

Main amplifier 706 utilizes devices $Q_7$ and $Q_8$ and auxiliary amplifier 702 utilizes devices $Q_1$ and $Q_2$. The main and auxiliary amplifiers each employ an emitter resistor $2R_1$. The inputs of the main and auxiliary amplifiers are driven together. The auxiliary amplifier loads are diode devices $Q_3$ and $Q_4$ which produce output voltages similar to the diodes in input buffer 102 of FIGS. 1–2. The diode output voltages are then used to drive transconductance amplifier 704 which is composed of devices $Q_5$ and $Q_6$ and emitter resistor $R_2$. Transconductance amplifier 704 is characterized by $G_m=1/R_1$ and drives each collector load resistor $R_1$ of main amplifier 706. As a result, the differential diode voltage is summed with the main amplifier output at nodes $V_{O1}$ and $V_{O2}$. Thus, the distortion is compensated without requiring series connections of diodes and load resistors in the collector loads of the main amplifier. As a result, input buffer 700 requires both lower power supply voltage and lower power consumption than conventional designs.

In input buffer 700, the diode voltages generated by auxiliary amplifier 702 are generated independent of (i.e., separate from) the resistor voltages generated by main amplifier 706. Transconductance amplifier 704 provides the functionality of adding the diode voltages of auxiliary amplifier 702 to the resistor voltages of main amplifier 706.

Input buffer 700 of FIG. 7 is designed for a near unity gain magnitude for TH amp 600 of FIG. 6. However, different gains can be designed by scaling the ratio of the load resistance to the emitter resistance. The linearization principle remains compatible with low voltage operation and a range of amplifier gains. Resistor $R_2$ of FIG. 7 is preferably selected slightly lower than $2R_1$, based on nominal parameter values, in order to reduce the systematic gain error of the transconductance amplifier. No attempt is made to correct the nonlinearity of transconductance amplifier 704 itself. The main and auxiliary amplifier integral nonlinearities, respectively $INL(V_R)$ and $INL(V_D)$, are of opposite sign. Thus, errors in scaling and summing these quantities still results in $|INL(V_{OUT})| << |INL(V_R)|$ and $|INL(V_{OUT})| << |INL(V_D)|$, as long as the errors are relatively small.

Figure 8:
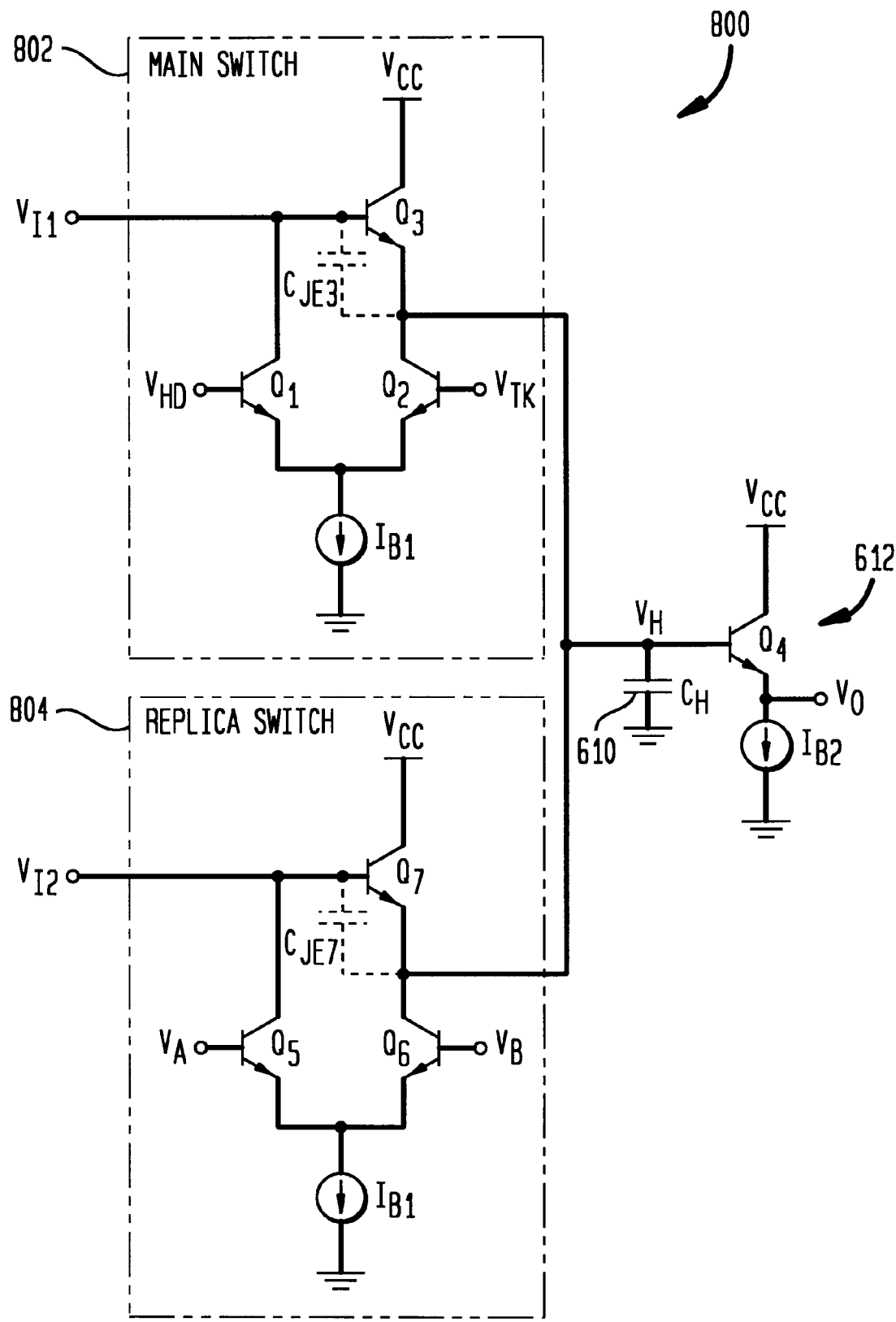
FIG. 8 shows a block diagram of a switch circuit for the track-and-hold amplifier of FIG. 6.

FIG. 8 shows a block diagram of switch circuit 800. In one implementation of TH amp 600 of FIG. 6, switch circuit 800 is used for each of first switch circuit 606 and second switch circuit 608. In FIG. 8, switch circuit 800 is depicted as it would be configured with each hold capacitor 610 and output buffer 612 of FIG. 6. Switch circuit 800 comprises main switch 802 and replica switch 804. Switch circuit 800 is designed to reduce feedthrough to limit interference with the operation of a high-resolution A/D converter driven by a TH amp such as TH amp 600 of FIG. 6.

In particular, replica switch 804 is used in order to provide a capacitance $C_{JE7}$ that closely approximates the parasitic capacitance $C_{JE3}$ of main switch 802. Replica switch 804 is continuously in the hold mode (i.e., open) with $V_A > V_B$. The input of replica switch 804 is driven opposite in phase compared to the input of main switch 802. The output of replica switch 804 is then coupled to the output of main switch 802. In this way, the output $V_H$ of hold capacitor 610 becomes close to an incremental ground during the hold mode of main switch 802 (i.e., open with $V_{TK} < V_{HD}$). When main switch 802 is in the track mode (i.e., closed with $V_{TK} > V_{HD}$), replica switch 804 remains in the hold mode and does not affect the output.

Referring again to FIG. 6, TH amp 600 is a fully differential amplifier with open-loop linearization and feedthrough reduction. Main and replica input buffers 602 and 604 are preferably based on the design of input buffer 700 of FIG. 7. Similarly, first and second switch circuits 606 and 608, hold capacitors 610, and output buffers 612 are preferably based on the design shown in FIG. 8. Since replica switch 804 of FIG. 8 remains in the hold mode at all times, the main and replica switch inputs cannot be driven by the differential outputs of a single input buffer. Thus, replica input buffer 604 of FIG. 6 is provided to drive the replica switch inputs.

Figure 9:
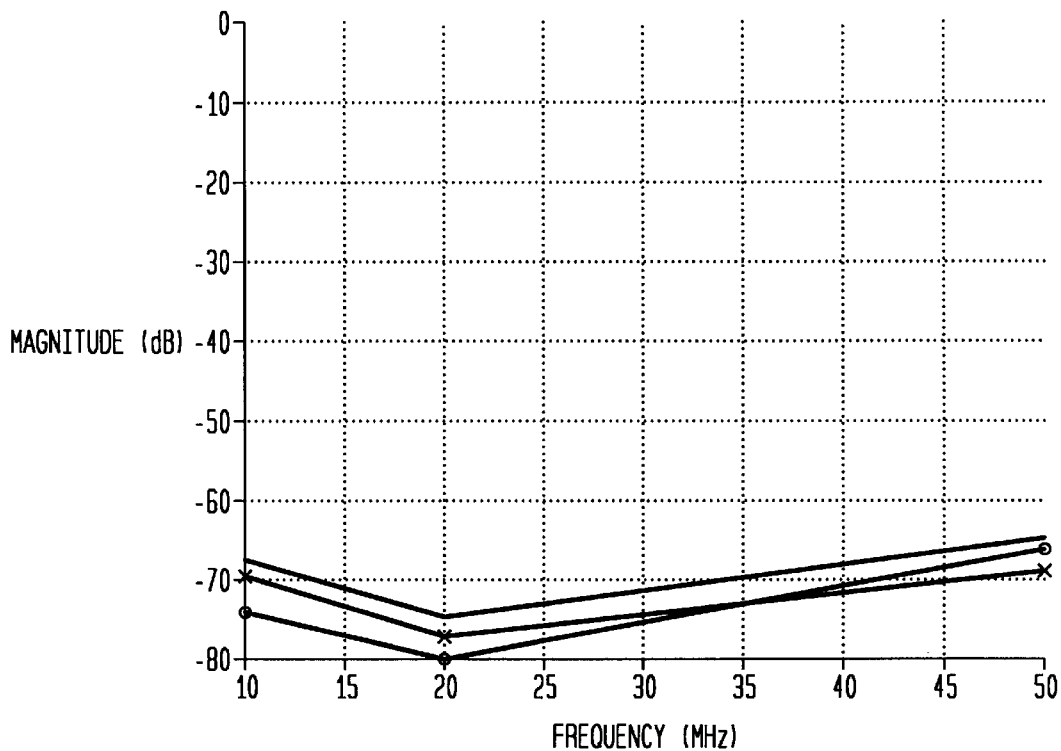
FIGS. 9–11 show graphical representations of measurements of the track-and-hold amplifier of FIG. 6 that were obtained with a high-frequency probe station.
Figure 10:
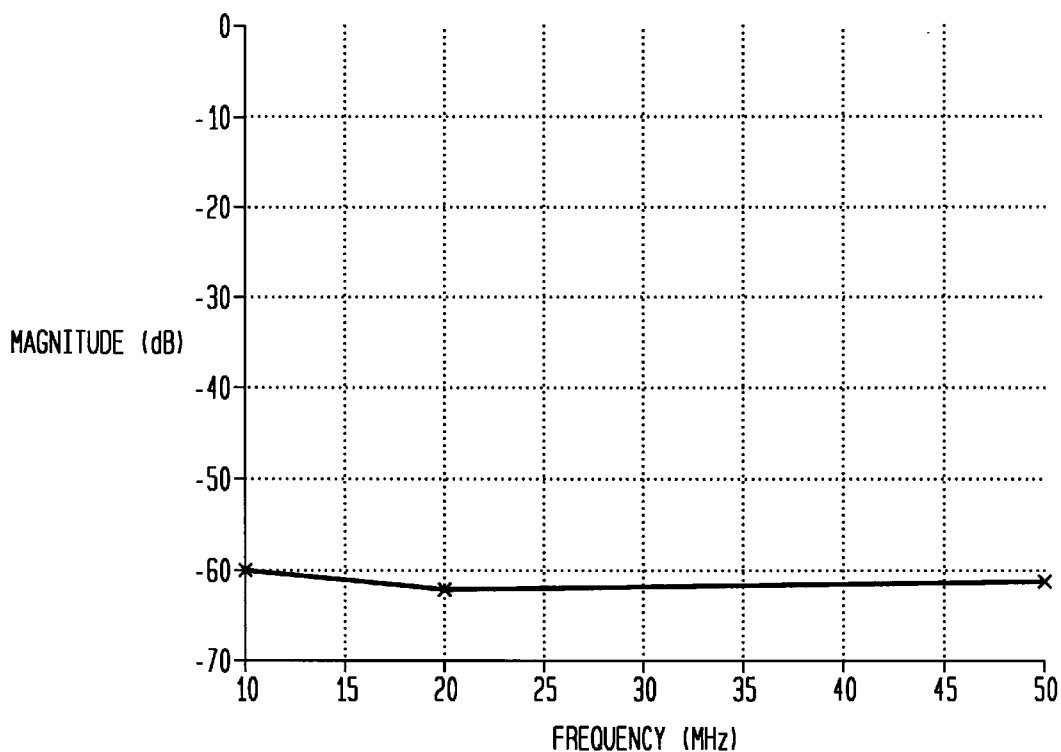
Figure 11:
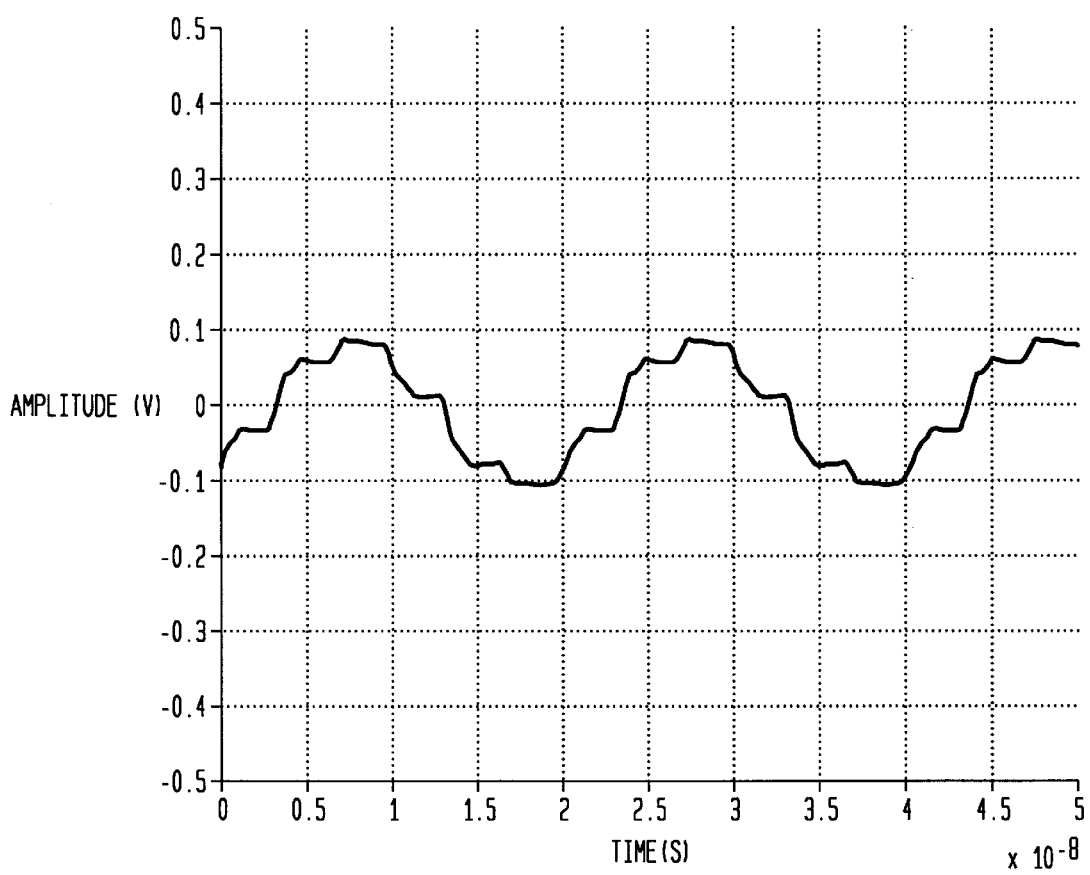

FIGS. 9–11 show graphical representations of measurements of TH amp 600 of FIG. 6 that were obtained with a high-frequency probe station. Frequency synthesizers were used to provide the clock and input sine waves. The synthesizers were phase locked for time-domain measurements and run free of each other during frequency domain measurements. The sine-wave input was filtered in order to attenuate the harmonic distortion from the frequency synthesizer. The differential clock and input signals were obtained with power splitters. The TH amp outputs drove a resistive attenuator to 50 ohms in order to reduce the loading on the output emitter followers. The differential TH amp outputs were combined in order to drive single-ended instruments. The total harmonic distortion (THD) measurement reflects the held values as well as the tracking components of the waveform. The measurements in FIGS. 9–11 are for a 300 MHz sampling frequency.

FIG. 9 shows the measured THD and the dominant harmonic distortion components HD2 and HD3 for a 10 MHz to 50 MHz FS sine-wave input. The THD is indicated in solid, the HD2 component is indicated with "*" and the HD3 component is indicated with "○".

FIG. 10 shows the measured feedthrough for a 10 MHz to 50 MHz FS sine-wave input.

FIG. 11 shows the measured time-domain output of the TH amp for a 50 MHz sine-wave input. The fully differential TH amp consumed 30 mW from a 2.7V power supply.

Figure 12:
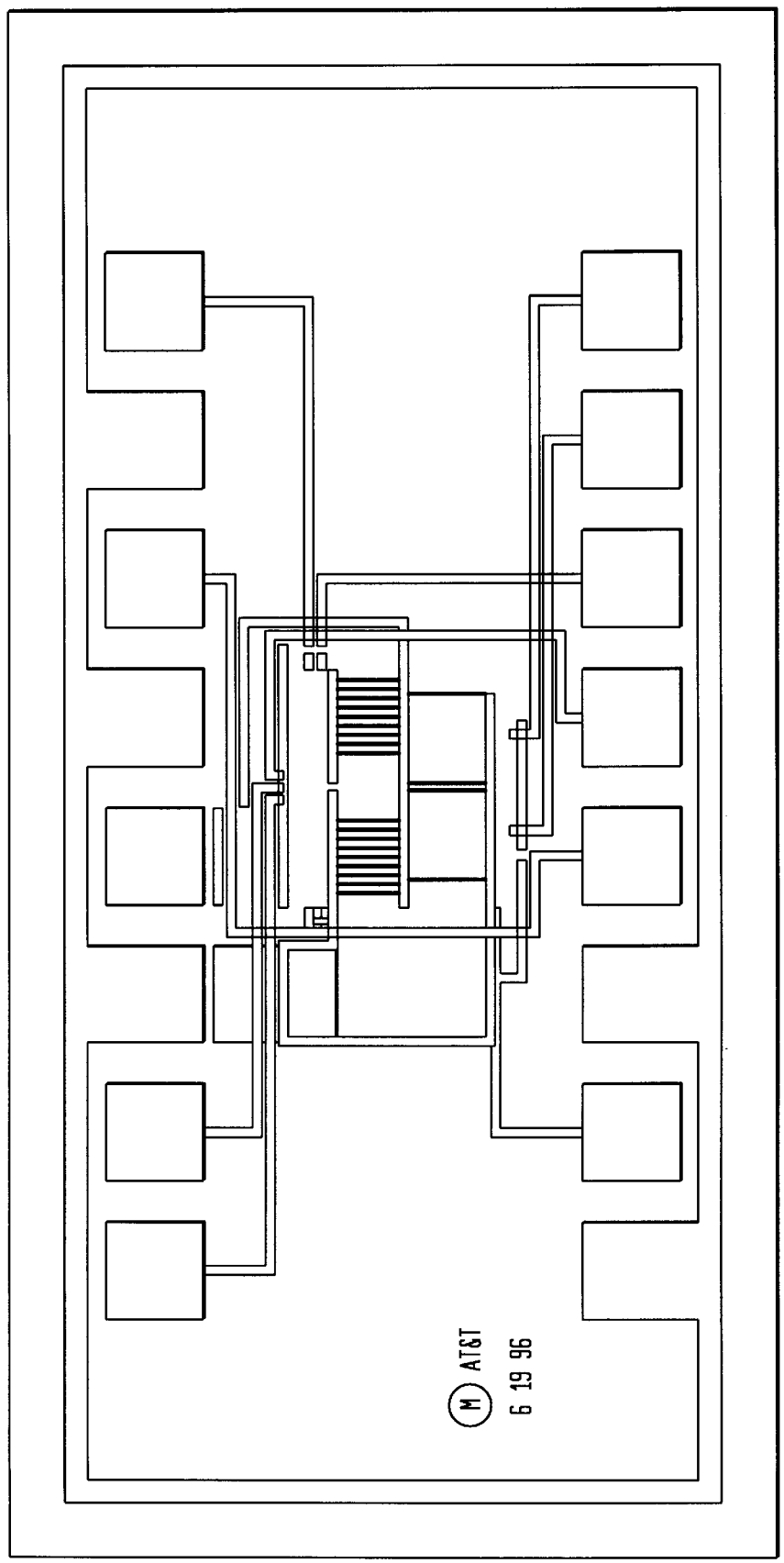
FIG. 12 shows a micrograph of one implementation of the track-and-hold amplifier of FIG. 6.

FIG. 12 shows a micrograph of one implementation of TH amp 600 of FIG. 6. The performance is summarized in Table I. The active area of the TH amp was approximately 0.3 mm×0.2 mm. The all n-p-n bipolar prototype was fabricated in a 0.5 µm, 18 GHz BiCMOS process.

TABLE I

| Summary of TH Amp Measurements | |
| --- | --- |
| Sampling frequency | 300 MHz |
| Differential analog input range | 0.5V p-p |
| THD (<50 MHz, FS input) | <−65 dB |
| Feedthrough (<50 MHz, FS input) | <−60 dB |
| Differential droop rate | 0.3 mV/µs |
| Supply voltage | 2.7 V |
| Power dissipation | 30 mW |

The present invention can be implemented using technologies other than bipolar, such as metal oxide semiconductor (MOS) technology. For example, all of the n-p-n bipolar devices may be replaced with all NMOS devices. With little topology change, all the bipolar devices could also be replaced with all PMOS devices.

Consider a bulk process CMOS-A that has a p-type substrate. CMOS-A has an n-well available for PMOS devices. The back-gate effect of an NMOS device in CMOS-A will negatively impact the linearity of a CMOS circuit built using the principles described in this specification. In CMOS-A, the PMOS device source and n-well can be connected together to reduce the back-gate effect. However, reduction of the back-gate effect is not perfect, particularly at higher frequencies. In addition, PMOS devices are slow.

Consider a bulk process CMOS-B that has an n-type substrate. CMOS-B has a p-well available for NMOS devices. The back-gate effect of a PMOS device in CMOS-B will negatively impact the linearity of a CMOS circuit built using the principles described in this specification. In CMOS-B, the NMOS device source and p-well can be connected together to reduce the back-gate effect. However, reduction of the back-gate effect is not perfect, particularly at higher frequencies. In addition, n-type substrates are not commonly used.

CMOS devices inherently have threshold voltage mismatch. Bipolar devices do not have such a mechanism. Therefore, the offset of a CMOS differential pair will typically be larger than the offset of a bipolar differential pair. As a result, the linearity of a CMOS input buffer using the open-loop linearization method of the present invention will typically be worse than the linearity of a bipolar input buffer using the open-loop linearization.

CMOS devices for analog circuits are typically operated in the saturation region but they may be operated in the sub-threshold region. In the saturation region, the devices are fast. In the sub-threshold region, the devices are slow, but also happen to exhibit device characteristics that are more like bipolar. CMOS devices used in a switched-capacitor context may be able to overcome the offset difficulty. However, the back-gate issue remains even if a CMOS switched-capacitor circuit is built.

In input buffer 700 of FIG. 7, transconductance amplifier 704 provides the functionality of adding the voltages $V_D$ from auxiliary amplifier 702 to voltages $V_R$ from main amplifier 706. Those skilled in the art will understand that such functionality may be implemented using designs other than that of transconductance amplifier 704. For example, an op-amp circuit could be used to sum $V_D$ and $V_R$. Another means could be a transformer that uses primary winding 1 for $V_D$ and primary winding 2 for $V_R$. Another method would be to quantize each of $V_D$ and $V_R$ with an analog-to-digital converter and perform the addition digitally.

The design of input buffer 700 of FIG. 7 can be applied to applications other than track-and-hold amplifiers such as TH amp 600 of FIG. 6. In general, input buffer of the present invention can be used in any application where fast, linear amplifiers are required with reduced supply voltage, such as in the quantizer of an A/D converter, a peak detector, a wideband amplifier, an intermediate frequency (IF) amplifier, or a voltage-controlled amplifier.

Furthermore, the design of TH amp 600 of FIG. 6 can be applied to applications other than A/D converters. In general, track-and-hold amplifiers of the present invention can be used in any application in which analog input signals are sampled for further processing, such as deglitchers for digital-to-analog converters or delay elements for sampled data analog infinite impulse response (IIR) or finite impulse response (FIR) filters.

The present invention does not have to be implemented as a differential circuit for all of the principles of the present invention to be applied. The open-loop linearization method may be applied to a single-ended circuit. However, single-ended implementations have disadvantages compared to differential implementations such as less power supply noise reduction and less common mode noise rejection.

In the present specification, the term resistance may be interpreted more broadly to include impedance and resistors to include impedance devices. Impedances used in place of resistors in the emitter circuits and the collector load circuits, respectively, must be related by a constant ratio. Thus, $Z_{collector}/Z_{emitter}=$constant. This is required because the non-linearity encoded in the collector current must then be decoded in order for the input buffer to have an overall linear transfer characteristic. A principal goal of the input buffer design is a linear transfer characteristic. If the ratio was not a constant, then the decoding process could not recover the desired voltage.

It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. An integrated circuit comprising a buffer circuit comprising:
   (a) a main amplifier adapted to generate resistor voltages;
   (b) an auxiliary amplifier adapted to generate diode voltages independent of the generation of the resistor voltages by the main amplifier; and
   (c) a component adapted to combine the diode voltages and the resistor voltages to generate a buffer output, wherein diode voltages are voltages across diode loads and resistor voltages are voltages across resistive loads.

2. The invention of claim 1, wherein the component is a transconductance amplifier adapted to convert a difference between the diode voltages into a difference current for resistors in the main amplifier.

3. The invention of claim 2, wherein the transconductance amplifier has a differential design comprising two current paths, each current path comprising a series connection of a current source and a transconductance-amplifier transistor device, the transconductance amplifier having a transconductor emitter resistor connecting the eintters of the transconductance-amplifier transistor devices.

4. The invention of claim 1, wherein:
   the main amplifier has a differential design comprising two current paths, each current path comprising a series connection of a current source, a main-amplifier transistor device, and a resistor, the main amplifier having a main emitter resistor connecting the emitters of the main-amplifier transistor devices; and
   the auxiliary amplifier has a differential design comprising two current paths, each current path comprising a series connection of a current source, an auxiliary-amplifier transistor device, and a diode device, the auxiliary amplifier having an auxiliary emitter resistor connecting the emitters of the auxiliary-amplifier transistor devices.

5. The invention of claim 1, wherein the buffer circuit is part of a track-and-hold amplifier.

6. The invention of claim 1, wherein the buffer circuit is coupled to a track-and-hold amplifier.

7. The invention of claim 2, wherein:
   the main amplifier has a differential design comprising two current paths, each current path comprising a series connection of a current source, a main-amplifier transistor device, and a load resistor, the main amplifier having a main emitter resistor connecting the emitters of the main-amplifier transistor devices;
   the auxiliary amplifier has a differential design comprising two current paths, each current path comprising a series connection of a current source, an auxiliary-amplifier transistor device, and a diode device, the auxiliary amplifier having an auxiliary emitter resistor connecting the emitters of the auxiliary-amplifier transistor devices; and
   the transconductance amplifier has a differential design comprising two current paths, each current path comprising a series connection of a current source and a transconductance-amplifier transistor device, the transconductance amplifier having a transconductor emitter resistor connecting the emitters of the transconductance-amplifier transistor devices, wherein:
   one side of each diode device and each load resistor is adapted to be connected to a bias voltage source;
   another side of each diode device is connected to the base of one of the transconductance-amplifier transistor devices; and
   the collector of each transconductance-amplifier transistor device is connected to the collector of one of the main-amplifier transistor devices.

8. The invention of claim 7, wherein:
   the resistance of the main emitter resistor is approximately double the resistance of each load resistor;
   the resistance of the main emitter resistor is approximately equal the resistance of the auxiliary emitter resistor;
   the resistance of the main emitter resistor is greater than the resistance of the transconductance emitter resistor.

9. The invention of claim 1, wherein the integrated circuit comprises a track-and-hold circuit adapted to generate an output from an input, the track-and-hold circuit comprising:

(a) a main input buffer adapted to generate two outputs from the input;

(b) a replica input buffer adapted to generate two outputs from the input, wherein the outputs from the replica input buffer are substantially out of phase with the outputs from the main input buffer;

(c) a first switch circuit connected to receive an output from the main input buffer and an output from the replica input buffer and adapted to generate a first-switch output signal;

(d) a second switch circuit connected to receive another output from the main input buffer and another output from the replica input buffer and adapted to generate a second-switch output signal;

(e) a first hold capacitor, one side connected to the output of the first switch circuit, another side adapted to be connected to a first bias voltage source, and adapted to accumulates the first-switch output signal while the first switch circuit is closed;

(f) a second hold capacitor, one side connected to the output of the second switch circuit, another side adapted to be connected to a second bias voltage source, and adapted to accumulate the second-switch output signal while the second switch circuit is closed;

(g) a first output buffer connected to the output of the first switch circuit and adapted to generate a first half of the output from the accumulated first-switch output signal when the first switch is open; and (h) a second output buffer connected to the output of the second switch circuit and adapted to generate a second half of the output from the second-switch output signal when the second switch is open, wherein at least one of the main input buffer and the replica input buffer is an instance of the buffer circuit.

10. The invention of claim 9, wherein each of the main input buffer and the replica input buffer is an instance of the buffer circuit.

11. The invention of claim 9, wherein the component is a transconductance amplifier adapted to convert a difference between the diode voltages into a difference current for resistors in the main amplifier.

12. The invention of claim 11, wherein the transconductance amplifier has a differential design comprising two current paths, each current path comprising a series connection of a current source and a transconductance-amplifier transistor device, the transconductance amplifier having a transconductor emitter resistor connecting the emitters of the transconductance-amplifier transistor devices.

13. The invention of claim 9, wherein:

the main amplifier has a differential design comprising two current paths, each current path comprising a series connection of a current source, a main-amplifier transistor device, and a resistor, the main amplifier having a main emitter resistor connecting the emitters of the main-amplifier transistor devices; and the auxiliary amplifier has a differential design comprising two current paths, each current path comprising a series connection of a current source, an auxiliary-amplifier transistor device, and a diode device, the auxiliary amplifier having an auxiliary emitter resistor connecting the emitters of the auxiliary-amplifier transistor devices.

14. The invention of claim 9, wherein the track-and-hold circuit is part of an analog-to-digital converter.

15. The invention of claim 9, wherein the track-and-hold circuit is coupled to an analog-to-digital converter.

16. The invention of claim 9, wherein the first and second bias voltage sources are both ground.

* * * * *

UNITED STATES PATENT AND TRADEMARK OFFICE
CERTIFICATE OF CORRECTION

PATENT NO. : 6,094,093
DATED : July 25, 2000
INVENTOR(S) : Andrew N. Karanicolas Page 1 of 1

It is certified that error appears in the above-identified patent and that said Letters Patent is hereby corrected as shown below:

Title page,
Add section 60 as follows:
--Related U.S. Application Data [60] Provisional Application No. 60/035,866, Jan. 22, 1997--.

Title page,
In section 56, References Cited, add:

| | | | |
|---|---|---|---|
| --3,643,110 | 2/1972 | Thompson | 307/238 |
| 4,823,027 | 4/1989 | Takahashi | 307/353 |
| 4,845,382 | 7/1989 | Eouzan et al. | 307/353 |
| 5,017,924 | 5/1991 | Guiberteau et al. | 342/195 |
| 5,061,865 | 10/1991 | Durst | 307/490 |
| 5,111,072 | 5/1992 | Seidel | 307/353 |
| 5,440,256 | 8/1995 | Erhart et al. | 327/94--. |

Signed and Sealed this

Fourteenth Day of August, 2001

*Attest:*

NICHOLAS P. GODICI
*Attesting Officer*     *Acting Director of the United States Patent and Trademark Office*